(12) United States Patent
Lin et al.

(10) Patent No.: US 11,114,612 B2
(45) Date of Patent: Sep. 7, 2021

(54) MAGNETORESISTIVE RANDOM ACCESS MEMORY AND METHOD FOR FABRICATING THE SAME

(71) Applicant: UNITED MICROELECTRONICS CORP., Hsin-Chu (TW)

(72) Inventors: Da-Jun Lin, Kaohsiung (TW); Bin-Siang Tsai, Changhua County (TW); Shih-Wei Su, Tainan (TW); Ting-An Chien, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 79 days.

(21) Appl. No.: 16/708,389

(22) Filed: Dec. 9, 2019

(65) Prior Publication Data
US 2021/0143324 A1 May 13, 2021

(30) Foreign Application Priority Data
Nov. 11, 2019 (TW) .................. 108140832

(51) Int. Cl.
*H01L 43/02* (2006.01)
*H01L 43/12* (2006.01)
*G11C 11/16* (2006.01)
*H01L 27/22* (2006.01)
*H01F 10/32* (2006.01)
*H01F 41/34* (2006.01)
*H01L 43/10* (2006.01)

(52) U.S. Cl.
CPC ............ *H01L 43/12* (2013.01); *G11C 11/161* (2013.01); *H01F 10/3254* (2013.01); *H01F 41/34* (2013.01); *H01L 27/222* (2013.01); *H01L 43/02* (2013.01); *H01L 43/10* (2013.01)

(58) Field of Classification Search
CPC ....... H01L 43/12; H01L 27/222; H01L 43/02; H01L 43/10; G11C 11/161; H01F 10/3254; H01F 41/34
USPC ........................................... 257/421
See application file for complete search history.

(56) References Cited

U.S. PATENT DOCUMENTS 9,472,753 B1 * 10/2016 Katine ............... H01L 43/12
2011/0032645 A1 * 2/2011 Noel .................. H01L 43/08
360/326

FOREIGN PATENT DOCUMENTS

WO WO-2019005127 A1 * 1/2019 ............. H01L 43/08

* cited by examiner

*Primary Examiner* — Jami Valentine Miller
(74) *Attorney, Agent, or Firm* — Winston Hsu

(57) ABSTRACT

A method for fabricating semiconductor device includes the steps of first forming a magnetic tunneling junction (MTJ) stack on a substrate, in which the MTJ stack includes a pinned layer on the substrate, a barrier layer on the pinned layer, and a free layer on the barrier layer. Next, part of the MTJ stack is removed, a first cap layer is formed on a sidewall of the MTJ stack, and the first cap layer and the MTJ stack are removed to form a first MTJ and a second MTJ.

20 Claims, 4 Drawing Sheets

MAGNETORESISTIVE RANDOM ACCESS MEMORY AND METHOD FOR FABRICATING THE SAME

BACKGROUND OF THE INVENTION

1. Field of the Invention

The invention relates to a semiconductor device and method for fabricating the same, and more particularly to a magnetoresistive random access memory (MRAM) and method for fabricating the same.

2. Description of the Prior Art

Magnetoresistance (MR) effect has been known as a kind of effect caused by altering the resistance of a material through variation of outside magnetic field. The physical definition of such effect is defined as a variation in resistance obtained by dividing a difference in resistance under no magnetic interference by the original resistance. Currently, MR effect has been successfully utilized in production of hard disks thereby having important commercial values. Moreover, the characterization of utilizing GMR materials to generate different resistance under different magnetized states could also be used to fabricate MRAM devices, which typically has the advantage of keeping stored data even when the device is not connected to an electrical source.

The aforementioned MR effect has also been used in magnetic field sensor areas including but not limited to for example electronic compass components used in global positioning system (GPS) of cellular phones for providing information regarding moving location to users. Currently, various magnetic field sensor technologies such as anisotropic magnetoresistance (AMR) sensors, GMR sensors, magnetic tunneling junction (MTJ) sensors have been widely developed in the market. Nevertheless, most of these products still pose numerous shortcomings such as high chip area, high cost, high power consumption, limited sensibility, and easily affected by temperature variation and how to come up with an improved device to resolve these issues has become an important task in this field.

SUMMARY OF THE INVENTION

According to an embodiment of the present invention, a method for fabricating semiconductor device includes the steps of first forming a magnetic tunneling junction (MTJ) stack on a substrate, in which the MTJ stack includes a pinned layer on the substrate, a barrier layer on the pinned layer, and a free layer on the barrier layer. Next, part of the MTJ stack is removed, a first cap layer is formed on a sidewall of the MTJ stack, and the first cap layer and the MTJ stack are removed to form a first MTJ and a second MTJ.

According to another aspect of the present invention, a semiconductor device includes a magnetic tunneling junction (MTJ) on a substrate. Preferably, the MTJ includes a pinned layer on the substrate, a barrier layer on the pinned layer, and a free layer on the barrier layer, in which a critical dimension of the free layer is different from a critical dimension of the pinned layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
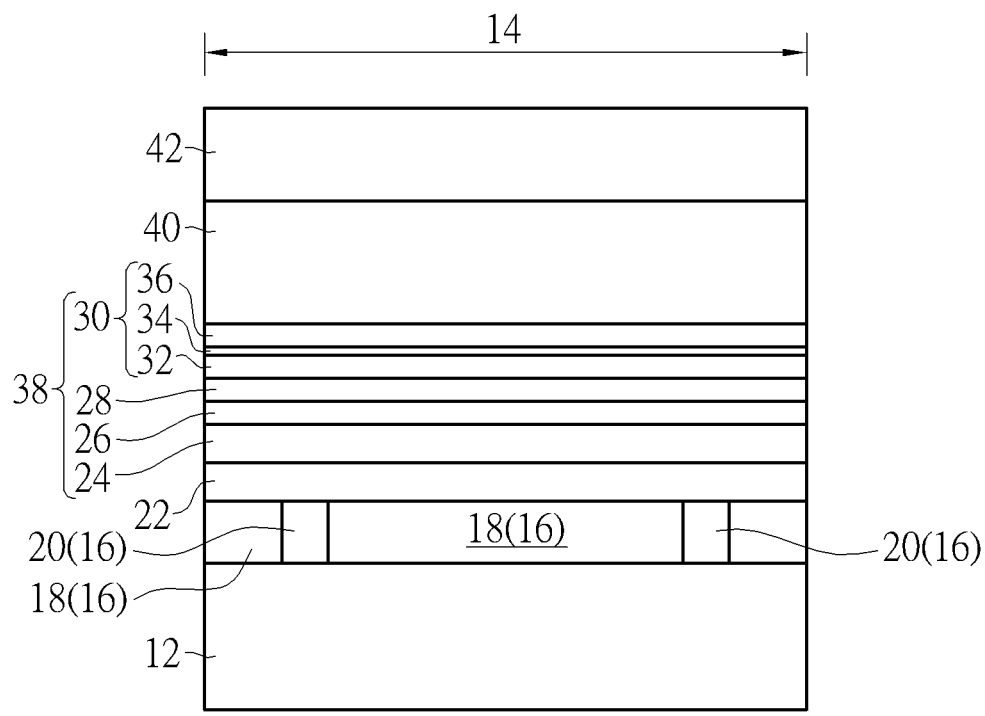
FIGS. 1-7 illustrate a method for fabricating a semiconductor device according to an embodiment of the present invention.

Referring to FIGS. 1-7, FIGS. 1-7 illustrate a method for fabricating a semiconductor device, or more specifically a MRAM device according to an embodiment of the present invention. As shown in FIG. 1, a substrate 12 made of semiconductor material is first provided, in which the semiconductor material could be selected from the group consisting of silicon (Si), germanium (Ge), Si—Ge compounds, silicon carbide (SiC), and gallium arsenide (GaAs), and a MTJ region 14 and a logic region (not shown) are defined on the substrate 12.

Active devices such as metal-oxide semiconductor (MOS) transistors, passive devices, conductive layers, and interlayer dielectric (ILD) layer could also be formed on top of the substrate 12. More specifically, planar MOS transistors or non-planar (such as FinFETs) MOS transistors could be formed on the substrate 12, in which the MOS transistors could include transistor elements such as gate structures (for example metal gates) and source/drain region 80, spacer, epitaxial layer, and contact etch stop layer (CESL). The ILD layer could be formed on the substrate 12 to cover the MOS transistors, and a plurality of contact plugs could be formed in the ILD layer to electrically connect to the gate structure and/or source/drain region of MOS transistors. Since the fabrication of planar or non-planar transistors and ILD layer is well known to those skilled in the art, the details of which are not explained herein for the sake of brevity.

Next, at least a metal interconnect structure such as metal interconnect structure 16 is formed on the ILD layer on the MTJ region 14 and the edge region to electrically connect the aforementioned contact plugs, in which the metal interconnect structure 16 includes an inter-metal dielectric (IMD) layer 18 and metal interconnections 20 embedded in the IMD layer 18. In this embodiment, each of the metal interconnections 20 from the metal interconnect structure 16 preferably includes a via conductor, in which each of the metal interconnections 20 could be embedded within the IMD layer 18 according to a single damascene process or dual damascene process. For instance, each of the metal interconnections 20 could further include a barrier layer and a metal layer, in which the barrier layer could be selected from the group consisting of titanium (Ti), titanium nitride (TiN), tantalum (Ta), and tantalum nitride (TaN) and the metal layer could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity. In this embodiment, the IMD layer 18 is preferably made of silicon oxide and the metal interconnections 20 preferably include tungsten, but not limited thereto.

Next, a bottom electrode 22 is formed on the surface of the IMD layer 18, a MTJ stack 38 including a pinned layer 24, a reference layer 26, a barrier layer 28, and a free layer 30 is formed on the bottom electrode 22, and a top electrode 40 and a hard mask 42 are formed on the MTJ stack 38. Preferably, the free layer 30 further includes a first free layer 32 disposed on the barrier layer 28, a stop layer 34 disposed on the first free layer 32, and a second free layer 36 disposed on the stop layer 34.

In this embodiment, the bottom electrode 22 and the top electrode 40 are preferably made of conductive material including but not limited to for example Ta, Pt, Cu, Au, Al, or combination thereof. The pinned layer 24 could be made of antiferromagnetic (AFM) material including but not limited to for example ferromanganese (FeMn), platinum manganese (PtMn), iridium manganese (IrMn), nickel oxide (NiO), or combination thereof, in which the pinned layer 24 is formed to fix or limit the direction of magnetic moment of adjacent layers. The reference layer 26 is disposed between the pinned layer 24 and the barrier layer 28, in which the reference layer 26 could be made of ferromagnetic material including but not limited to for example iron, cobalt, nickel, or alloys thereof such as cobalt-iron-boron (CoFeB). The barrier layer 28 could be made of insulating material including but not limited to for example oxides such as aluminum oxide ($AlO_x$) or magnesium oxide (MgO). The first free layer 32 and the second free layer 36 from the free layer 30 could be made of ferromagnetic material including but not limited to for example iron, cobalt, nickel, or alloys thereof such as cobalt-iron-boron (CoFeB), in which the magnetized direction of the free layer 30 could be altered freely depending on the influence of outside magnetic field. The stop layer 34 between the first free layer 32 and the second free layer 36 on the other hand preferably includes tantalum (Ta) and the hard mask 42 preferably includes silicon oxide or silicon nitride.

Figure 2:
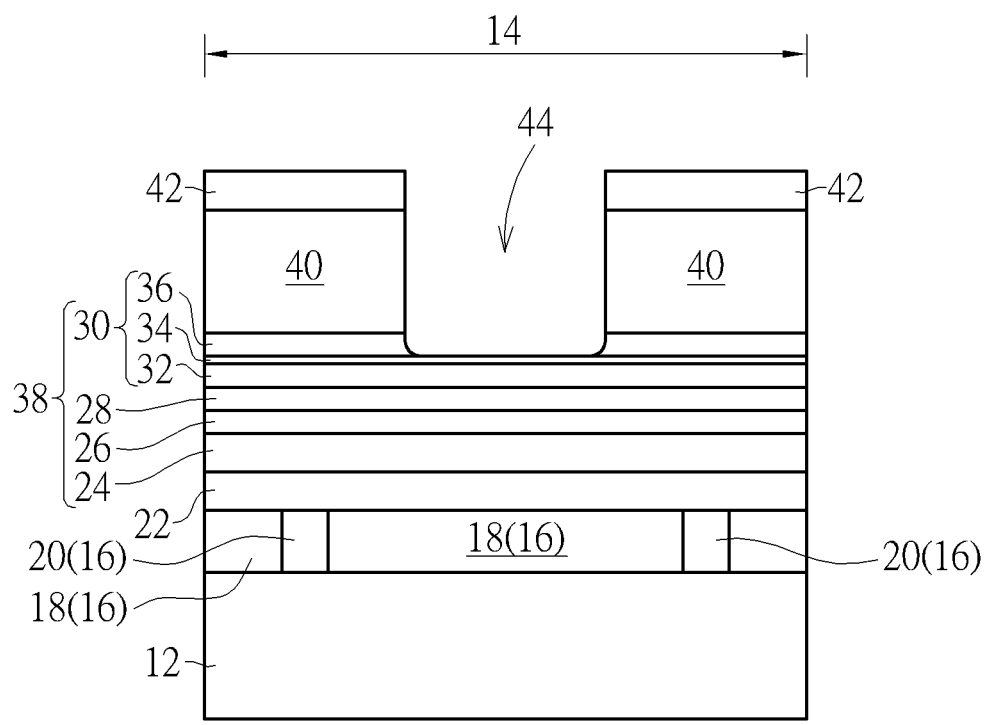

Next, as shown in FIG. 2, a pattern transfer process is conducted by using a patterned mask such as a patterned resist to remove part of the hard mask 42, part of the top electrode 40, and part of the free layer 30 or more specifically part of the second free layer 36 within the free layer 30 through etching to form a recess 44 exposing the surface of the stop layer 34.

Figure 3:
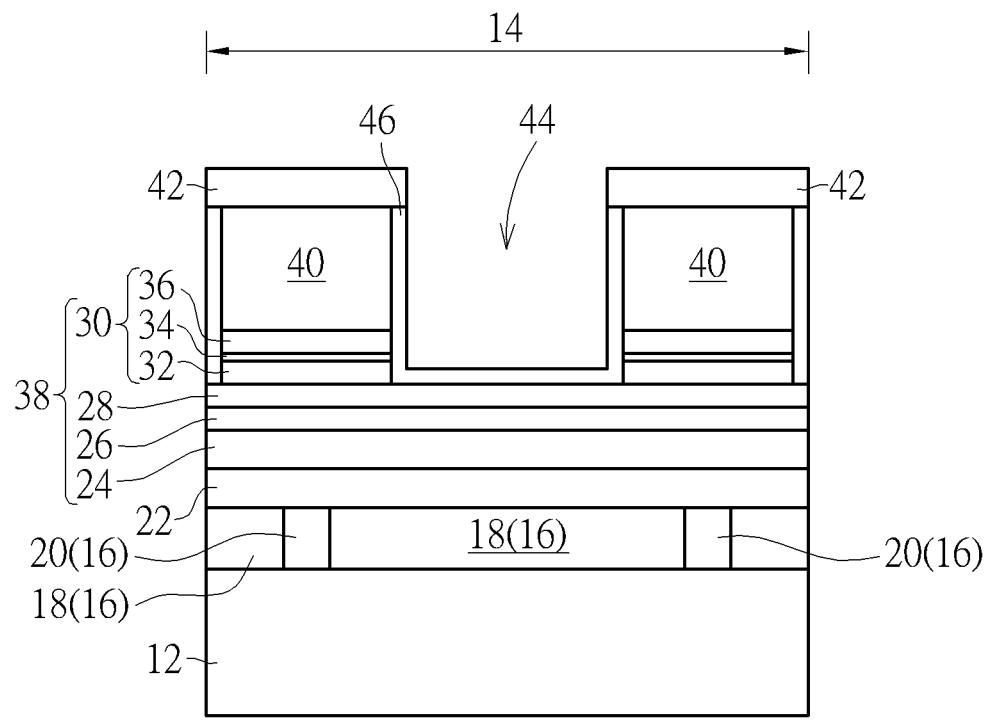

Next, as shown in FIG. 3, an oxidation process is conducted to form a first cap layer 46 on the top electrode 40 and the free layer 30. Specifically, the oxidation process conducted at this stage is accomplished by employing an oxygen soak process to oxidize sidewalls of the top electrode 40, sidewalls of the free layer 30, and the stop layer 34 and first free layer 32 directly under the recess 44 to form a first cap layer 46 made of oxidized metal (or oxidized metals), in which the oxidized metals could be different depending on the material of the layer being oxidized. For instance, if the top electrode 40 were made of tantalum (Ta), the first cap layer 46 formed directly contacting the top electrode 40 preferably includes tantalum oxide (TaO). It should also be noted that since the oxidation process preferably oxidizes all of the stop layer 34 and first free layer 32 directly under the recess 44, the first cap layer 46 is ultimately formed on sidewalls of the top electrode 40, sidewalls of the second free layer 36, sidewalls of the stop layer 34, sidewalls of the first free layer 32, and also directly contacting the top surface of the barrier layer 28.

Figure 4:
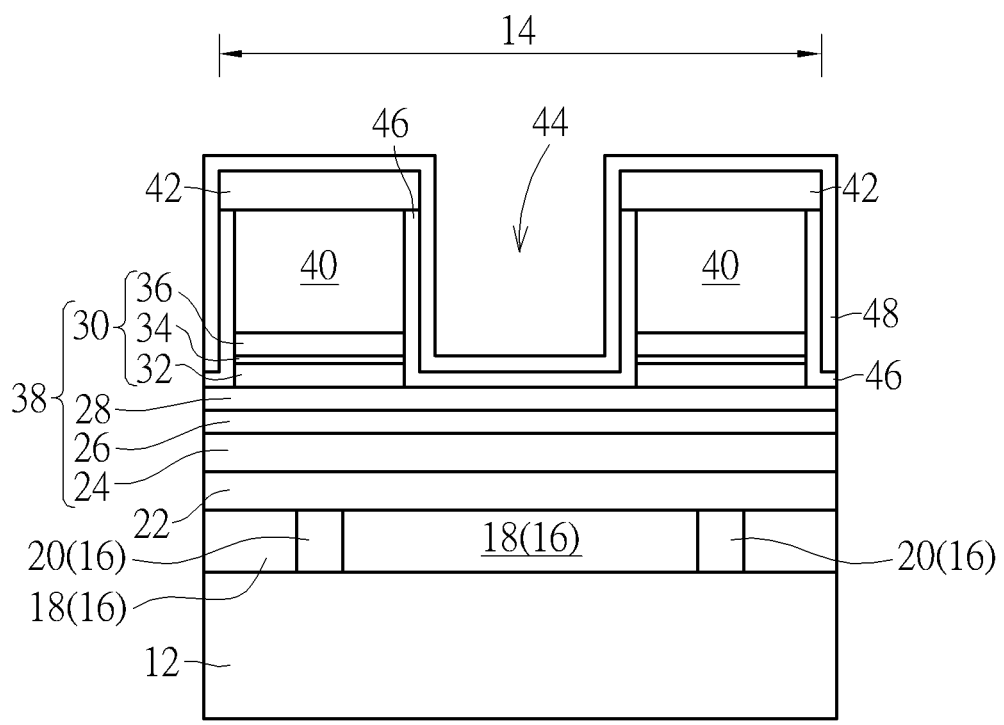

Next, as shown in FIG. 4, a second cap layer 48 is formed on the hard mask 42 and the first cap layer 46, in which the second cap layer 48 is conformally formed into the recess 44 without filling the recess 44 entirely. In this embodiment, the second cap layer 48 preferably includes silicon nitride, but not limited thereto.

Figure 5:
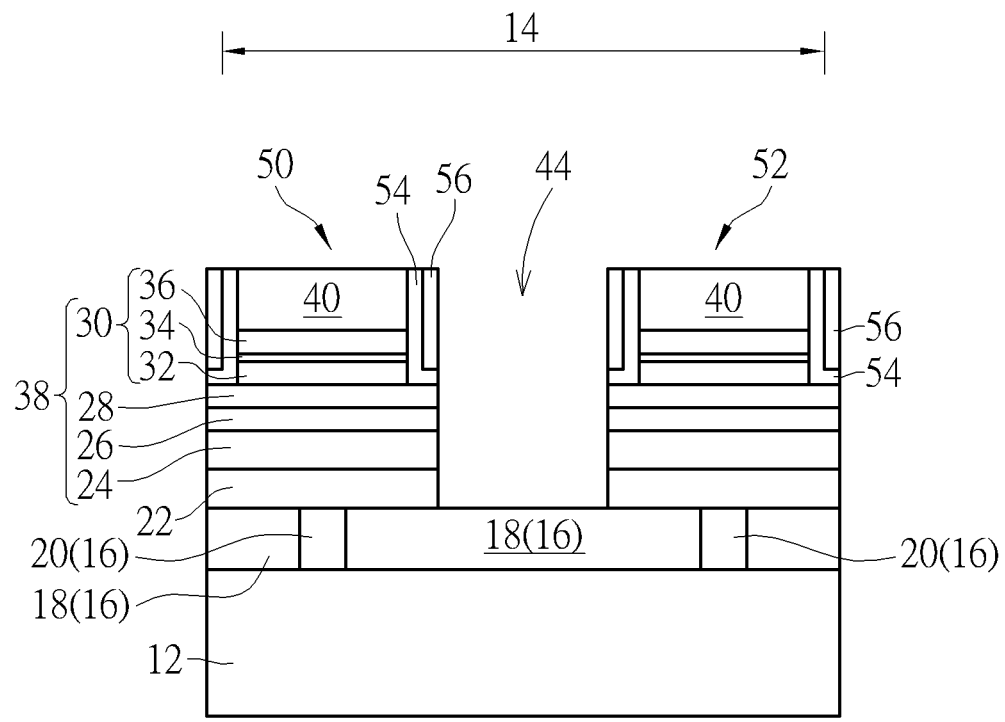

Next, as shown in FIG. 5, one or more etching process could be conducted without forming additional mask to remove part of the second cap layer 48, part of the first cap layer 46, the entire hard mask 42, part of the top electrode 40, part of the barrier layer 28, part of the reference layer 26, part of the pinned layer 24, part of the bottom electrode 22, and even part of the IMD layer 18 to form a plurality of MTJs 50, 52 on the substrate 12 and at the same time form a first spacer 54 and a second spacer 56 adjacent to the free layer 30 and the top electrode 40. Preferably, the first spacer 54 having an L-shape cross-section is formed from the first cap layer 46 and the second spacer 56 having an I-shape cross-section is formed from the second cap layer 48, in which sidewalls of the first spacer 54 and the second spacer 56 are aligned to sidewalls of the barrier layer 28, the reference layer 26, the pinned layer 24, and the bottom electrode 22 while the hard mask 42 is removed entirely during the etching process.

In this embodiment, the etching process conducted to form the MTJs 50, 52 could include a reactive ion etching (ME) process and/or an ion beam etching (IBE) process. Due to the characteristics of the IBE process, the top surface of the remaining IMD layer 18 could be slightly lower than the top surface of the metal interconnections 20 on adjacent to two sides and the top surface of the IMD layer 18 could reveal a curve or an arc (not shown in the figure).

Figure 6:
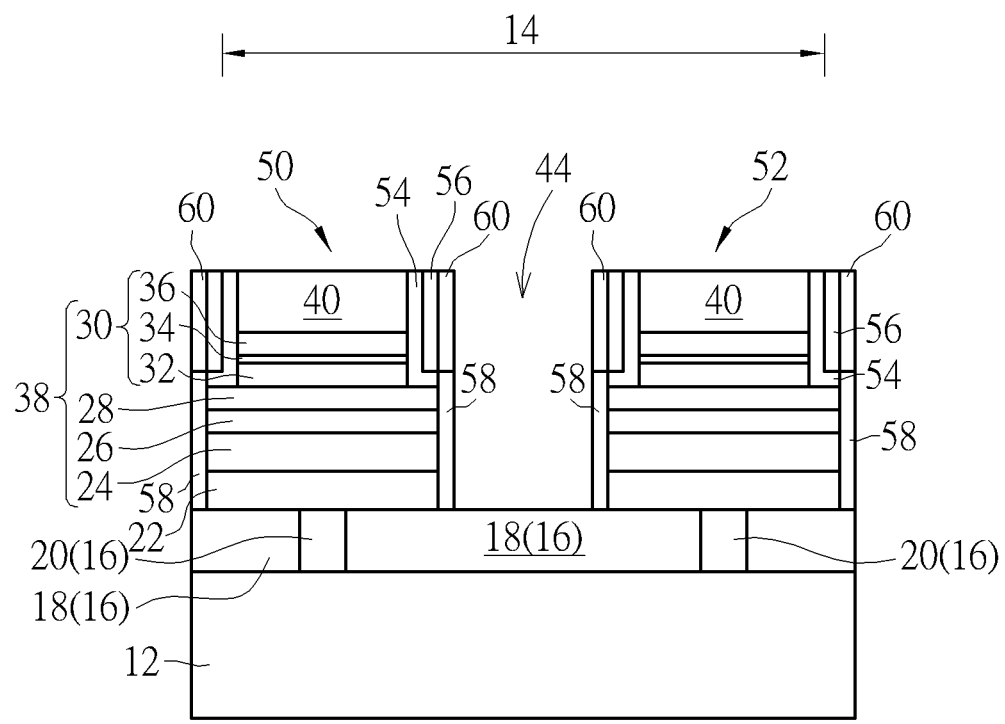

Next, as shown in FIG. 6, another oxidation process is conducted followed by an optional etching back process to form a third spacer 58 on sidewalls of the first spacer 54, the barrier layer 28, the reference layer 26, the pinned layer 24, and the bottom electrode 22 and at the same time form a fourth spacer 60 adjacent to the second spacer 56 and on the third spacer 58. Similar to the formation of the first spacer 54, the third spacer 58 and fourth spacer 60 formed through the oxidation process preferably include different oxidized materials depending on the material of the layer being oxidized. Specifically, the third spacer 58 formed adjacent to the barrier layer 28, reference layer 26, pinned layer 24, and bottom electrode 22 preferably includes different oxidized metals depending on the material of each of the layers 28, 26, 24, 22 while the fourth spacer 60 adjacent to the second spacer 56 preferably includes different oxidized dielectric material. For instance, if the bottom electrode 22 were made of Ta, the third spacer 58 directly contacting the bottom electrode 22 would preferably include TaO. Similarly, if the second spacer 56 is made of silicon nitride (SiN), the fourth spacer 60 directly contacting the second spacer 56 would be made of silicon oxynitride (SiON).

Figure 7:
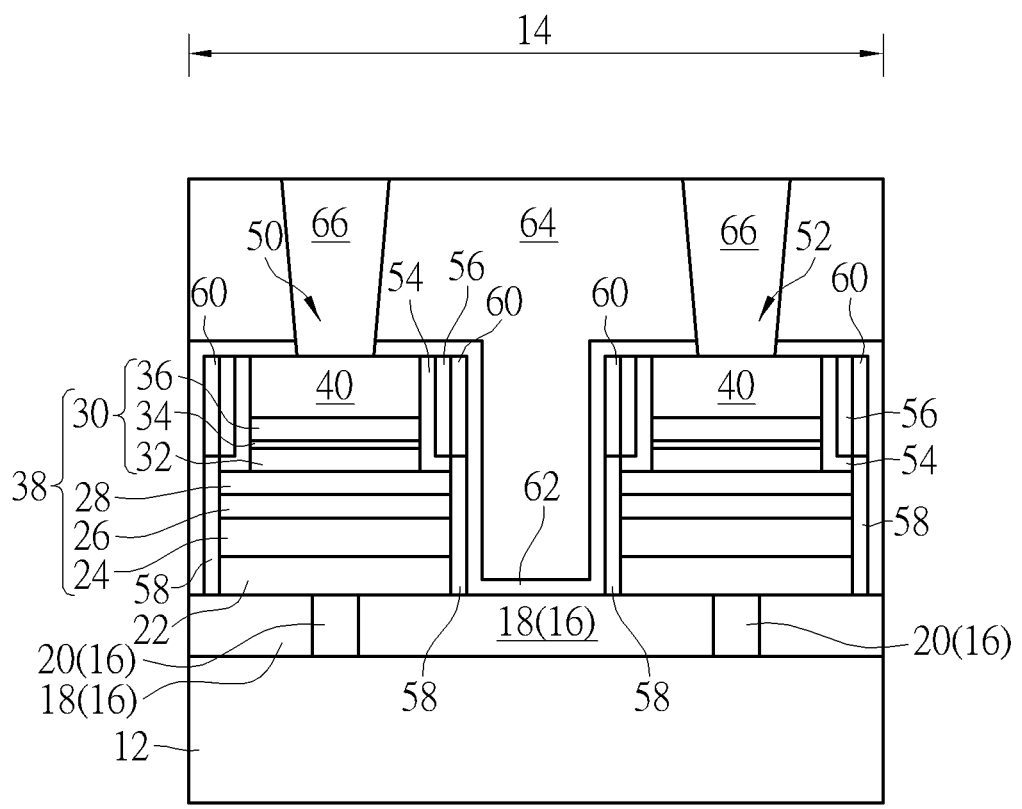

Next, as shown in FIG. 7, a third cap layer 62 is formed on the top electrode 40, the second spacer 56, the third spacer 58, and the fourth spacer 60. In this embodiment, the third cap layer 62 preferably includes a hydrogen-free dielectric layer including but not limited to for example aluminum oxide ($Al_2O_3$), zirconium oxide ($ZrO_2$), tantalum oxide ($Ta_2O_5$), aluminum nitride (AlN), or combination thereof. Next, one or more IMD layer 64 is formed on the MTJs 50, 52 to cover the third cap layer 62, one or more photo-etching process is conducted to remove part of the IMD layer 64 to form contact holes (not shown), conductive materials are deposited into each of the contact holes, and a planarizing process such as chemical mechanical polishing (CMP) process is conducted to form metal interconnections 66 connecting the top electrodes 40. This completes the fabrication of a semiconductor device according to an embodiment of the present invention.

In this embodiment, each of the metal interconnections 66 could be formed in the IMD layer 64 through a single damascene or dual damascene process. For instance, each of the metal interconnections 66 could further include a barrier layer and a metal layer, in which the barrier layer could be selected from the group consisting of titanium (Ti), titanium nitride (TiN), tantalum (Ta), and tantalum nitride (TaN) and the metal layer could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity. This completes the fabrication of a semiconductor device according to an embodiment of the present invention.

Referring again to FIG. 7, FIG. 7 further illustrates a structural view of a semiconductor device according to an embodiment of the present invention. As shown in FIG. 7, the semiconductor device preferably includes at least a MTJ such as the MTJ 50 disposed on the substrate 12, a bottom electrode 22 disposed under the MTJ 50, and a top electrode 40 disposed on the MTJ 50, in which the MTJ 50 includes a pinned layer 24, a reference layer 26 on the pinned layer 24, a barrier layer 28 on the reference layer 26, and a free layer 30 on the barrier layer 28, in which the critical dimension of the free layer 30 is different from the critical dimension of the pinned layer 24.

Viewing from a more detailed perspective, the width of the top electrode 40 is equal to the width of the free layer 30, the width of free layer 30 is less than the width of the barrier layer 28, the width of the free layer 30 is less than the width of the reference layer 26, and the width of the free layer 30 is less than the width of the pinned layer 24, in which the free layer 30 further includes a first free layer 32, a stop layer 34, and a second free layer 36, the first free layer 32, the stop layer 34, and the second free layer 36 share equal thickness, and the barrier layer 28, the reference layer 26, and the pinned layer 24 share equal thickness.

The semiconductor device further includes a first spacer 54, a second spacer 56, a third spacer 58, and a fourth spacer 60 adjacent to sidewalls of the MTJ 60, in which the first spacer 54 is disposed on sidewalls of the free layer 30 and the top electrode 40, the second spacer 56 is disposed on sidewalls of the first spacer 54, the third spacer 58 is disposed on sidewalls of the barrier layer 28, the reference layer 26, and the pinned layer 24, and the fourth spacer 60 is disposed on sidewalls of the second spacer 56 and on top of the third spacer 58. Preferably, the sidewalls of the first spacer 54 and the second spacer 56 are aligned with the sidewalls of the barrier layer 28, reference layer 26, and pinned layer 24 while the sidewalls of the fourth spacer 60 is aligned with the sidewalls of the third spacer 58.

In this embodiment, the first spacer 54 preferably includes a L-shape cross-section while each of the second spacer 56, the third spacer 58, and the fourth spacer 60 includes an I-shape cross-section. The semiconductor device further includes a cap layer such as a third cap layer 62 disposed on the MTJ 50 to cover the top surfaces of the first spacer 54 and second spacer 56 and sidewalls of the third spacer 58 and fourth spacer 60, in which the third cap layer 62 preferably includes a hydrogen-free dielectric layer including but not limited to for example aluminum oxide ($Al_2O_3$), zirconium oxide ($ZrO_2$), tantalum oxide ($Ta_2O_5$), aluminum nitride (AlN), or combination thereof.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
   forming a magnetic tunneling junction (MTJ) stack on a substrate;
   removing part of the MTJ stack;
   forming a first cap layer on a sidewall of the MTJ stack; and
   removing portions of the first cap layer and portions of the MTJ stack to form a first MTJ and a second MTJ.

2. The method of claim 1, wherein the MTJ stack comprises a pinned layer on the substrate, a barrier layer on the pinned layer, and a free layer on the barrier layer, the method comprising:
   forming a top electrode on the MTJ stack;
   removing the top electrode and the free layer;
   forming the first cap layer on sidewalls of the top electrode and the free layer; and
   removing the first cap layer, the barrier layer, and the pinned layer to form the first MTJ and the second MTJ.

3. The method of claim 2, wherein the free layer comprises:
   a first free layer on the barrier layer;
   a stop layer on the first free layer; and
   a second free layer on the stop layer.

4. The method of claim 3, further comprising:
   forming a hard mask on the top electrode;
   removing the hard mask, the top electrode and the second free layer; and
   forming the first cap layer on sidewalls of the top electrode, the second free layer, the stop layer, and the first free layer and a top surface of the barrier layer.

5. The method of claim 4, further comprising:
   forming a second cap layer on the hard mask and the first cap layer; and
   removing the second cap layer, the first cap layer, the hard mask, the barrier layer, and the pinned layer to form a first spacer and a second spacer adjacent to the free layer and the top electrode.

6. The method of claim 5, wherein a sidewall of the first spacer is aligned with a sidewall of the barrier layer.

7. The method of claim 5, wherein a sidewall of the second spacer is aligned with a sidewall of the barrier layer.

8. The method of claim 5, further comprising:
   performing an oxidation process to form a third spacer on sidewalls of the barrier layer and the pinned layer; and
   forming a third cap layer on the top electrode, the second spacer, and the third spacer.

9. The method of claim 8, further comprising performing the oxidation process to form a fourth spacer on the third spacer.

10. The method of claim 8, wherein the third cap layer comprises a hydrogen-free dielectric layer.

11. The method of claim 1, further comprising performing an oxidation process to form the first cap layer.

12. A semiconductor device, comprising:
   a magnetic tunneling junction (MTJ) on a substrate, wherein the MTJ comprises:
      a pinned layer on the substrate;
      a barrier layer on the pinned layer; and
      a free layer on the barrier layer, wherein a critical dimension of a bottom surface of the free layer is different from a critical dimension of a top surface of the barrier layer.

13. The semiconductor device of claim 12, wherein a width of the free layer is less than a width of the pinned layer.

14. The semiconductor device of claim 12, further comprising a reference layer between the barrier and the pinned layer.

15. The semiconductor device of claim 14, wherein a width of the free layer is less than a width of the reference layer.

16. The semiconductor device of claim 14, wherein the free layer and the reference layer comprise same material.

17. The semiconductor device of claim 14, further comprising:
   a first spacer on sidewalls of the free layer;
   a second spacer on the first spacer; and
   a third spacer on sidewalls of the reference layer and pinned layer.

18. The semiconductor device of claim 17, wherein the first spacer comprises a L-shape.

19. The semiconductor device of claim 17, further comprising a cap layer on sidewalls of the third spacer.

20. The semiconductor device of claim 19, wherein the cap layer comprises a hydrogen-free dielectric layer.

* * * * *